United States Patent
Tezuka et al.

(10) Patent No.: US 9,373,659 B2
(45) Date of Patent: Jun. 21, 2016

(54) METHOD OF MANUFACTURING SOLID-STATE IMAGE PICKUP APPARATUS

(71) Applicant: CANON KABUSHIKI KAISHA, Tokyo (JP)

(72) Inventors: Tomoyuki Tezuka, Sagamihara (JP); Yukihiro Hayakawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/875,543

(22) Filed: Oct. 5, 2015

(65) Prior Publication Data

US 2016/0104742 A1    Apr. 14, 2016

(30) Foreign Application Priority Data

Oct. 14, 2014 (JP) ................. 2014-210223

(51) Int. Cl.
*H01L 21/4763* (2006.01)
*H01L 27/146* (2006.01)

(52) U.S. Cl.
CPC .... *H01L 27/14685* (2013.01); *H01L 27/14689* (2013.01)

(58) Field of Classification Search
CPC .................................................. H01L 21/4763
See application file for complete search history.

(56) References Cited

FOREIGN PATENT DOCUMENTS

| JP | 2007-35698 A | 2/2007 |
|---|---|---|
| JP | 2007-287872 A | 11/2007 |

*Primary Examiner* — Marvin Payen
(74) *Attorney, Agent, or Firm* — Canon USA, Inc. IP Division

(57) ABSTRACT

One or more methods of manufacturing a solid-state image pickup apparatus and one or more methods of manufacturing a light reflection member are provided herein, and one or more embodiments thereof may include forming a first insulating film and forming a photoresist pattern on the first insulating film. Furthermore, one or more embodiments of such methods may include forming an opening portion by removing the first insulating film while having the photoresist pattern serve as a mask and forming a light reflection member on a sidewall of the opening portion formed in the first insulating film.

9 Claims, 8 Drawing Sheets

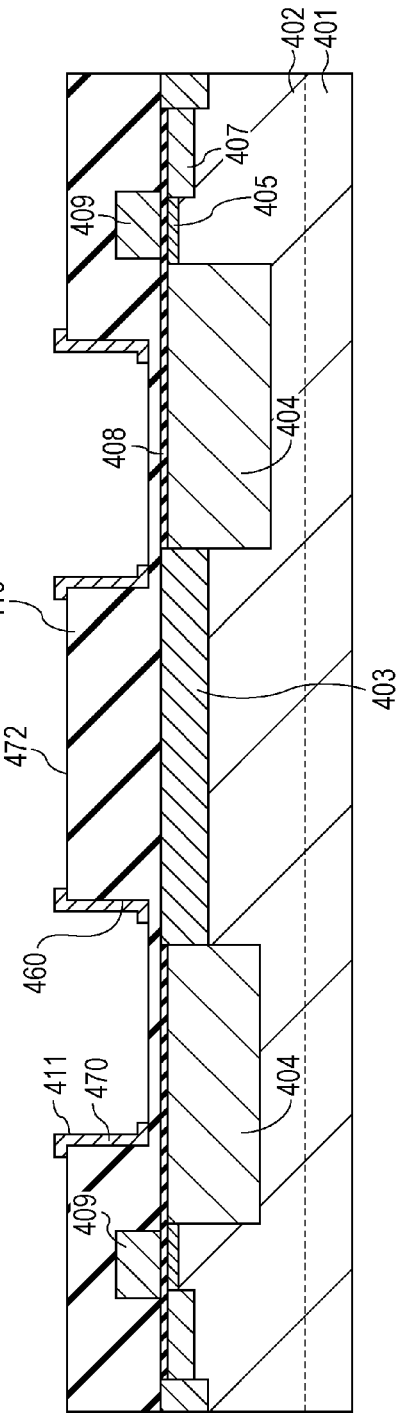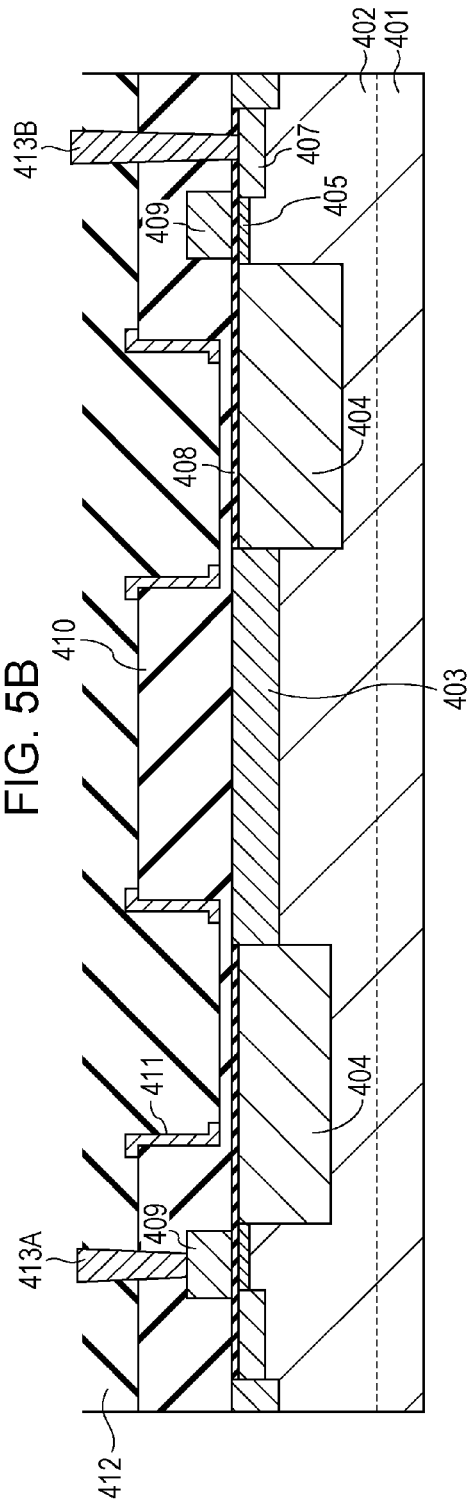

METHOD OF MANUFACTURING SOLID-STATE IMAGE PICKUP APPARATUS

BACKGROUND OF THE INVENTION

1. Field of the Invention

The present disclosure relates to a method of manufacturing a solid-state image pickup apparatus such as a CCD sensor and a CMOS sensor.

2. Description of the Related Art

FIG. 1 illustrates a solid-state image pickup apparatus described in Japanese Patent Laid-Open No. 2007-287872. The solid-state image pickup apparatus of FIG. 1 includes photodiodes 33 in a substrate 21, charge transfer electrodes 23 on the substrate 21, the charge transfer electrodes 23 transferring signal charges detected by the photodiodes 33, and microlenses (not shown) that are formed on a surface on a light receiving side. A light shielding film 27 that functions also as a light reflection members is formed above the photodiodes 33 so as to form openings. Furthermore, Japanese Patent Laid-Open No. 2007-287872 discloses, as a method of forming the light shielding film 27, a method in which the light shielding film 27 is formed on a surface of a buffer oxide film and the like after depositing the buffer oxide film and the like on a surface of the charge transfer electrodes 23.

In a solid-state image pickup apparatus, in order to prevent reduction of sensitivity, it is effective to dispose the light reflection members that help collect light to the photodiodes near the photodiodes. Incidentally, in the method of manufacturing the light reflection members described in Japanese Patent Laid-Open No. 2007-287872, the light shielding film 27 is formed on the surface of the buffer oxide film and the like after depositing the buffer oxide film and the like on the surfaces of the charge transfer electrodes 23. However, in the manufacturing method described in Japanese Patent Laid-Open No. 2007-287872, since the light reflection members are formed on a plurality of films after the plurality of films are formed on the charge transfer electrodes, the shapes and positions of the light reflection members are affected by the shapes and positions of the charge transfer electrodes. In other words, in the manufacturing method described in Japanese Patent Laid-Open No. 2007-287872, degree of freedom in setting the shapes and positions of the light reflection members is small. Accordingly, if the matching between the position of the optical system such as the microlenses and the like and the shapes and positions of the light reflection members are insufficient, there are cases in which the light reflected by the light reflection members does not reach the photodiodes. As a result, the light collection efficiency of the photodiodes may not be improved sufficiently.

SUMMARY OF THE INVENTION

The present disclosure proposes at least one method of manufacturing a light reflection member that is capable of forming the shapes and positions thereof in an optional manner regardless of the shapes and positions of the charge transfer electrodes.

At least one method of manufacturing a solid-state image pickup apparatus according to the present disclosure includes forming a first insulating film on a substrate that includes a photoelectric conversion portion and a gate electrode of a pixel transistor, the first insulating film covering the photoelectric conversion portion and the gate electrode of the pixel transistor; forming a photoresist pattern on the first insulating film; forming an opening portion by removing the first insulating film formed above the photoelectric conversion portion while having the photoresist pattern serve as a mask; forming a light reflection member on a sidewall of the opening portion formed in the first insulating film; forming a second insulating film on the first insulating film and the light reflection member; and forming, after the second insulating film has been formed, a contact plug that penetrates the first insulating film and the second insulating film and that is in contact with the gate electrode of the pixel transistor.

According to other aspects of the present disclosure, one or more additional methods of manufacturing a solid-state image pickup apparatus and one or more methods of manufacturing a light reflection member are discussed herein. Further features of the present disclosure will become apparent from the following description of exemplary embodiments with reference to the attached drawings.

BRIEF DESCRIPTION OF THE DRAWINGS

FIGS. 5A and 5B are diagrams illustrating a flow of the manufacturing method according to the first exemplary embodiment.

DESCRIPTION OF THE EMBODIMENTS

Hereinafter, a method of manufacturing a solid-state image pickup apparatus according to the present disclosure will be described. In the present exemplary embodiment, an example in which the method of manufacturing a solid-state image pickup apparatus according to the present disclosure is applied to manufacturing of a CMOS-type solid-state image pickup apparatus is given; however, the method can be applied to manufacturing of other systems as well.

The solid-state image pickup apparatus according to the present exemplary embodiment includes photoelectric conversion portions (hereinafter, the description will be given with photodiodes as an example) that each perform photoelectric conversion on incident light to generate a signal charge, and a pixel region that is configured with pixels that are arranged in a matrix and that are configured by a plurality of pixel transistors. Furthermore, the solid-state image pickup apparatus according to the present exemplary embodiment includes a peripheral circuit region that is formed in the peripheral of the pixel region. The pixel transistors of the pixel region include transfer transistors that transfer electric charges generated in the photodiodes, reset transistors that reset signal charges, amplification transistors that amplify photodiode signals, selection transistors, and the like.

Hereinafter, in association with FIG. 3, the solid-state image pickup apparatus illustrated in FIG. 2 and the method of manufacturing the apparatus will be described. Notations such as "S1" stated in the present description denote each of the steps illustrated in FIG. 3.

S1

Figure 1:
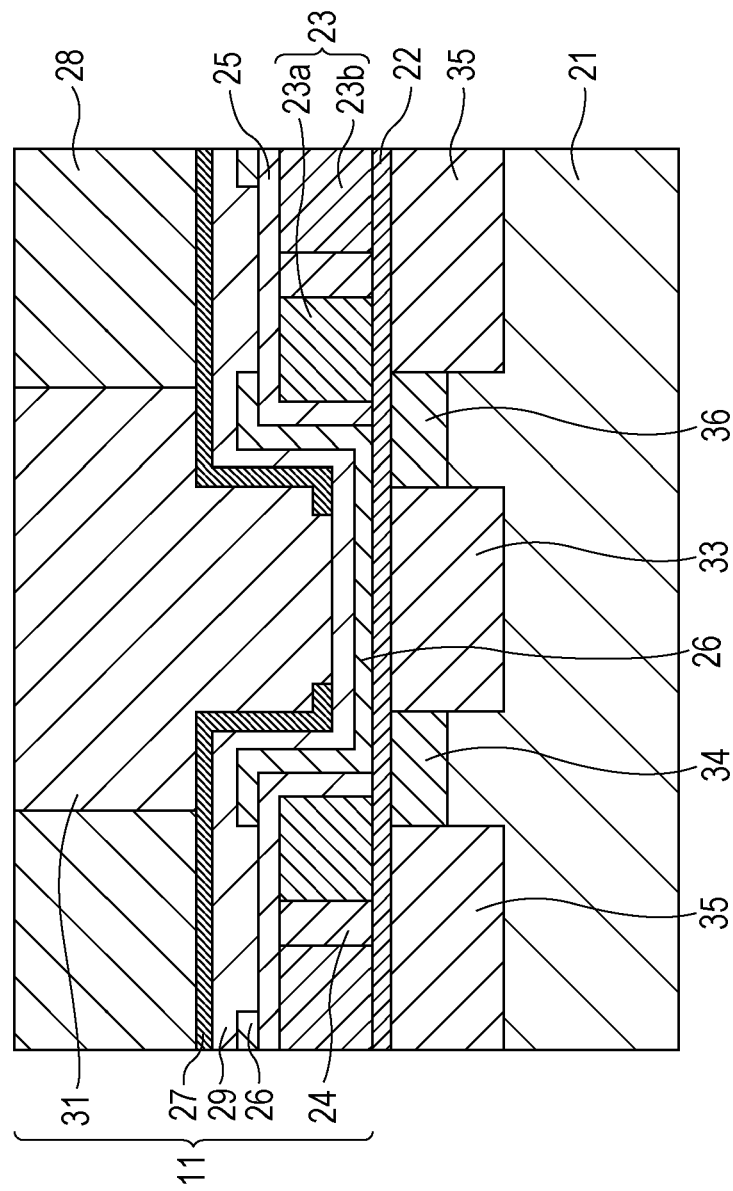
FIG. 1 is a schematic cross-sectional view for describing a solid-state image pickup apparatus of the related art.
Figure 2:
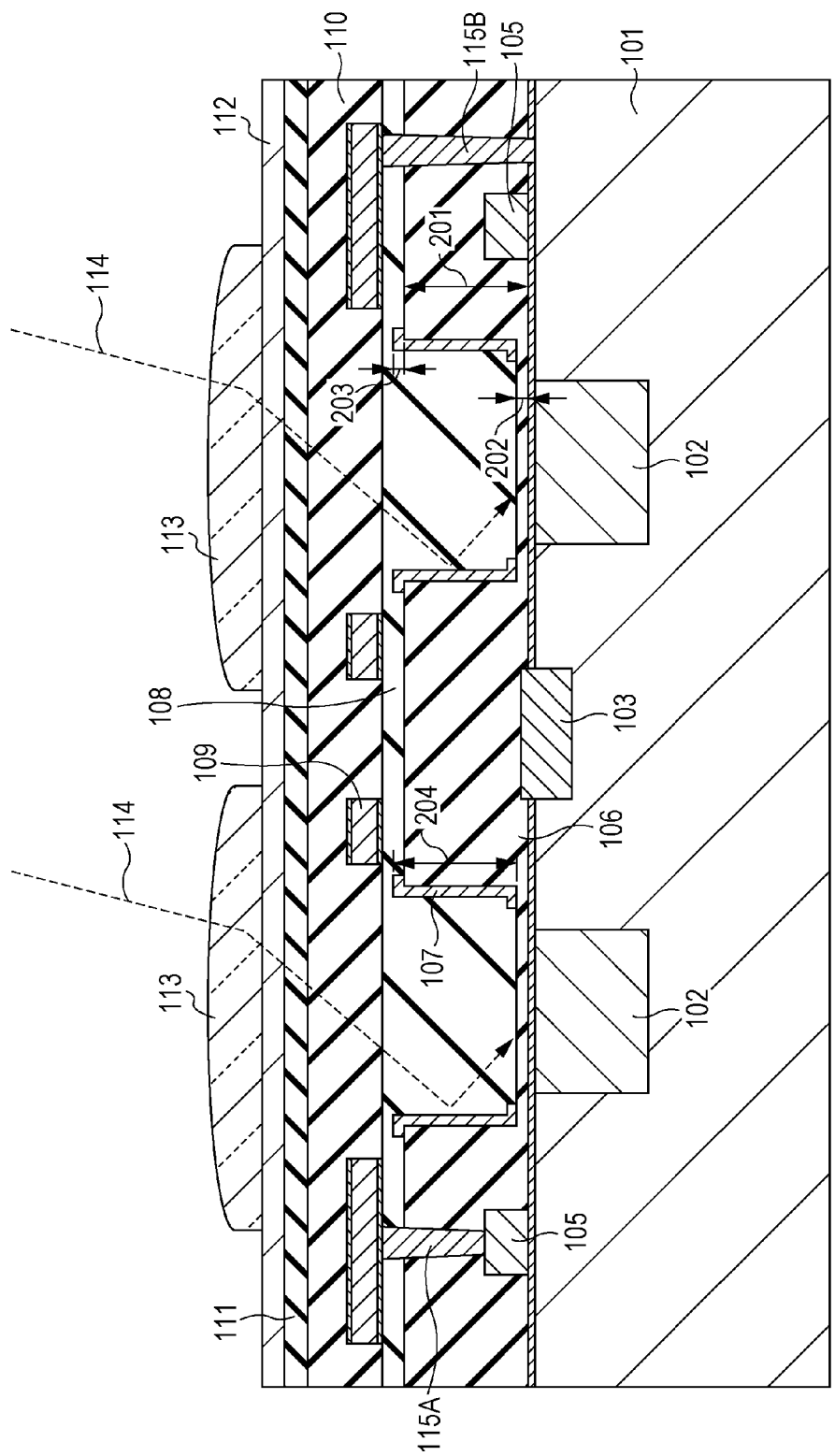
FIG. 2 is a cross-sectional view of a solid-state image pickup apparatus that has been fabricated using a manufacturing method according to the claimed disclosure.
Figure 3:
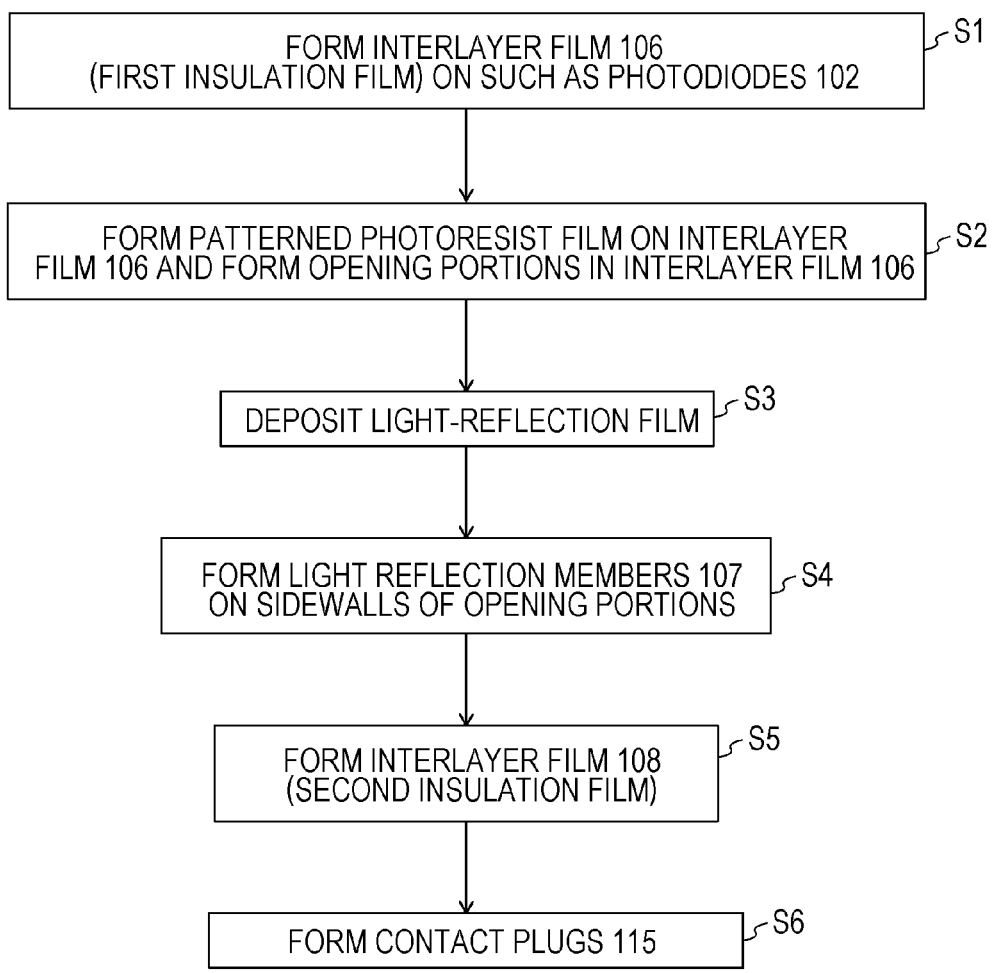
FIG. 3 is a flow diagram of the manufacturing method according to the claimed disclosure.

An interlayer film 106 serving as a first insulating film is first formed so as to cover photodiodes 102, element isolation regions 103, and gate electrodes 105 of transfer transistors, which are formed in or on the substrate 101 illustrated in FIG. 2. The interlayer film 106 is a layer used to determine the shapes and positions of the light reflection members 107.

S2

Subsequently, a photoresist film is formed on the interlayer film 106. The photoresist film is patterned by photolithography such that a photoresist pattern is formed. Portions of the interlayer film 106 are removed by etching in which an anisotropic dry etching process having the photoresist pattern as a mask is performed. Opening portions are formed above the photodiodes 102 in the above manner.

S3

Subsequently, a light-reflection film is deposited on the interlayer film 106.

S4

Subsequently, portions of the light-reflection film are removed by etching such that the light reflection members 107 remain on the sidewalls of the opening portions.

In S2, the positions of the light reflection members 107 in a substrate in-plane direction can be optionally selected by adjusting the position at which the photoresist pattern is formed. Accordingly, the positions at which the light reflection members 107 are formed can be selected regardless of the positions of the gate electrodes 105 of the transfer transistors. Furthermore, in the manufacturing method of Japanese Patent Laid-Open No. 2007-287872, the shapes of the light reflection members reflect the shapes of the gate electrodes of the transfer transistors. On the other hand, in the manufacturing method according to the present exemplary embodiment, the shapes of the light reflection members 107 are defined by the shape of the interlayer film 106 that is patterned by using photolithography. Accordingly, the shapes of the light reflection members can be formed regardless of the shapes of the gate electrodes of the transfer transistors. With the above, the light reflection members 107 can be disposed so as to guide light 114 guided by the microlenses 113 to the photodiodes 102 efficiently. A height 204 of the light reflection members 107 is determined by a deposited film thickness 201 of the interlayer film 106, a remaining film thickness 202 after etching the interlayer film 106, and a deposited film thickness 203 of a light shielding material. Specifically, the above can be expressed by the following expression.

$$(204)=(201)-(202)+(203) \qquad \text{Expression (1)}$$

Furthermore, the distances between the light reflection members 107 and the photodiodes 102 can be changed by controlling the remaining film thickness 202 of the interlayer film 106 after the etching. In a case in which a metal material is used for the light reflection members 107, by designing the remaining film thickness 202 large, the light reflection members 107 can be positioned away from the photodiodes 102. Accordingly, metal contamination of the photodiodes 102 caused by diffusion of metal can be reduced and dark current can be reduced.

S5

Subsequently, after formation of the light reflection members 107, an interlayer film 108 serving as a second insulating film is formed. The interlayer film 108 is to have a film thickness that can sufficiently fill the steps formed by etching the interlayer film 106. Furthermore, chemical mechanical polishing is performed on the interlayer film 108 to planarize the surface.

S6

Subsequently, contact plugs 115A that penetrate the interlayer film 106 and the interlayer film 108 and that are in contact with the gate electrodes of the transfer transistors are formed. Furthermore, in the same process, contact plugs 115B that are in contact with floating diffusions that configure drain regions of the transfer transistors are formed. In other words, the process of forming the contact plugs 115A and 115B is a process that is different from the process in which the light reflection members 107 are formed.

A wiring layer 109 that is electrically connected to the contact plugs 115A is used as wiring used to operate the transfer transistors.

An interlayer film 110 is formed on the wiring layer 109 so that the surface on the microlens 113 side is flat, and a passivation film 111 is deposited on the interlayer film 110. Last of all, a base layer 112 of the microlenses 113 is coated and the microlenses 113 are formed, such that the solid-state image pickup apparatus illustrated in FIG. 2 is obtained.

Note that while a description of the transfer transistors has been given above as an example, the light reflection members for other pixel transistors can be formed with similar processes.

First Exemplary Embodiment

Hereinafter, with reference to the schematic cross-sectional views of the solid-state image pickup apparatus in FIGS. 4 to 6, a flow of the manufacturing process of the present exemplary embodiment will be described in a more specific manner.

FIG. 4A

A semiconductor substrate in which an epitaxial layer 402 is formed on a semiconductor substrate 401 is prepared. Element isolation regions 403 are formed in the epitaxial layer 402. The element isolation regions 403 are formed by patterning the epitaxial layer 402 by photolithography and an anisotropic dry etching and by embedding a silicone oxide film in a groove formed by the patterning. After embedding the silicon oxide film, a planarization of the surface of the substrate is performed. Alternatively, the element isolation regions 403 may be formed by thermal oxidation of the semiconductor substrate. When employing the thermal oxidation process, anisotropic dry etching, embedding of the silicone oxide film, and planarization do not have to be performed. Furthermore, in order to form the element isolation regions 403, a PN junction-isolation process in which a dopant is implanted into the epitaxial layer 402 may be employed.

Figure 4A:
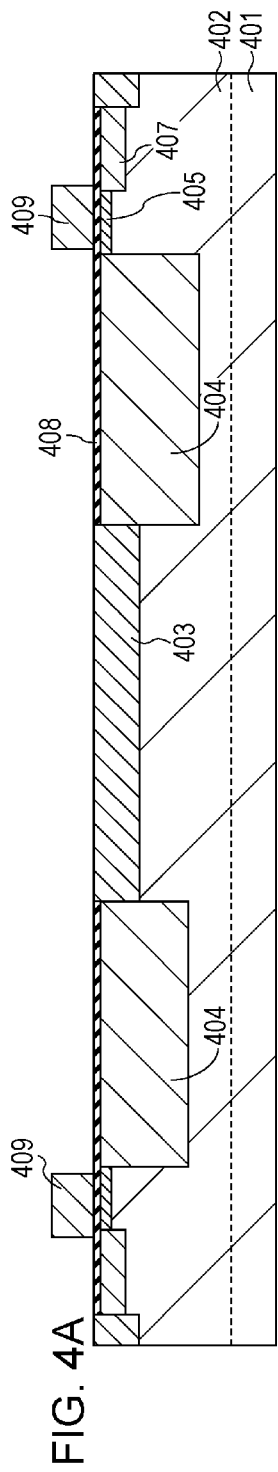
FIGS. 4A to 4C are diagrams illustrating a flow of the manufacturing method according to a first exemplary embodiment.
Figure 4B:
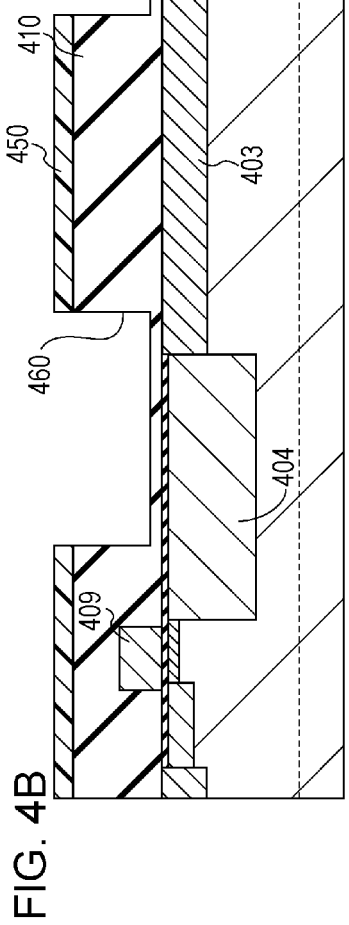

Subsequently, a dopant is implanted into the epitaxial layer 402 to form photodiodes 404. Each photodiode 404 includes a PN junction configured by a semiconductor region of a first conductivity type (a p-type, for example) and a semiconductor region of a second conductivity type (an n-type, for example). Furthermore, in order to form channel regions 405 and drain regions 407 of the transfer transistors, a dopant is implanted into the semiconductor region of the first conductivity type. In FIG. 4A, the photodiodes 404 are the source regions of the transfer transistors. Furthermore, a gate insulating film 408 is formed by performing thermal oxidation and the like on the surface of the semiconductor region of the first conductivity type and the like. The film thickness of the gate insulating film 408 is about 3 to 8 nm. Subsequently, gate electrodes 409 of the transfer transistors are formed. The gate electrodes 409 are obtained by, after depositing polysilicon, patterning the polysilicon. The patterning may employ a method in which a resist mask is used or a method in which a hard mask formed of silicon oxide film is used. For example, the height of each gate electrode 409 is about 150 to 300 nm.
FIG. 4B Subsequently, an interlayer film 410 that is to become the first insulating film is deposited. Silicon oxide film that is formed by CVD or the like is used as the interlayer film 410. The thickness of the interlayer film 410 needs to be a thickness that is capable of sufficiently coating the gate electrodes 409 and that is capable of sufficiently reducing the unevenness created by the gate electrodes 409, and the thickness is about 400 to 900 nm.

Furthermore, in order to obtain satisfactory coverage characteristics, an oxide film that has good embedding characteristics may be employed as the interlayer film 410. For example, boron doped silicon glass (BPSG) may be employed.

Subsequently, chemical mechanical polishing (CMP) is performed on the interlayer film 410 in order to provide a planarized surface. Note that the thickness of the interlayer film 410 immediately after the deposition and the amount of etching of the interlayer film 410 by CMP are factors determining heights of light reflection members 411 illustrated in FIG. 5A. If the thickness of the interlayer film 410 immediately after the deposition were to be set thin, the surface of the interlayer film 410 may become rough under the influence of the gate electrodes 409 and the like. Accordingly, the interlayer film 410 may be formed to have a thickness that is thicker than the desired thickness and, subsequently, may be planarized and made thin by CMP. Conversely, in a case in which the planar characteristics of the interlayer film 410 are not required in the process such as when the thickness of the interlayer film 410 is formed relatively thick, the planarization process by CMP may be omitted.

Subsequently, a resist layer is formed on the interlayer film 410, and a photoresist pattern 450 is formed using photolithography so that the resist remains above the gate electrodes 409. With the photoresist pattern 450 serving as a mask, opening portions 460 are formed on the interlayer film 410 using anisotropic etching.

While the opening portions 460 may be formed so as to penetrate through the interlayer film 410, the photodiodes 404 may be damaged. Accordingly, etching is performed to midway of the interlayer film 410 in forming the opening portions 460. The depth of the etching can be controlled through time or an etch stop layer may be formed before the interlayer film 410 is formed so as to cover the gate electrodes 409 and the depth of the etching may be controlled by using the etch stop layer.

Figure 4C:
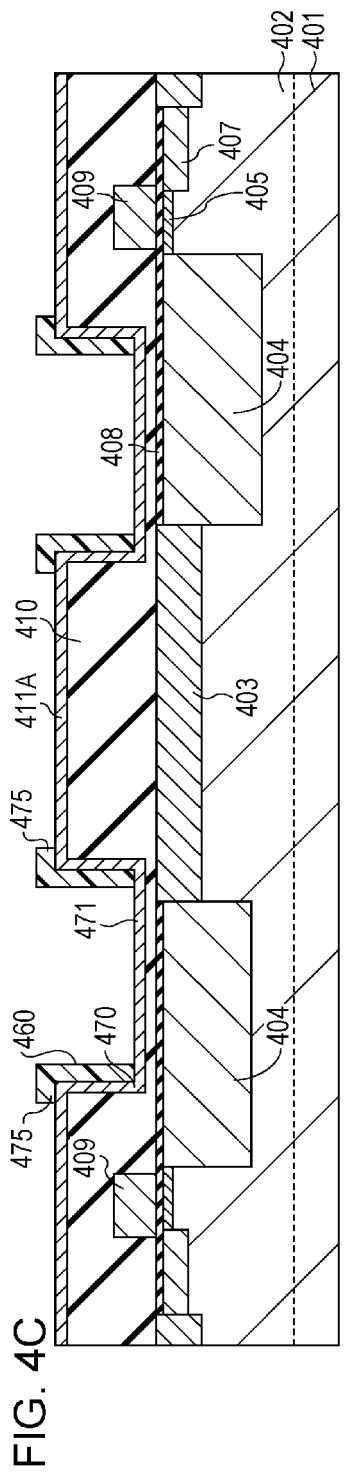

In FIG. 4B, an example has been given in which the resist is made to remain on the entire portions above the gate electrodes 409 and in which the interlayer film 410 is formed to cover the entire gate electrodes 409. However, there may exist a pixel transistor having a configuration in which a resist is made to remain on a portion of an upper portion of each gate electrode and in which the interlayer film is formed on only a portion of each gate electrode.
FIG. 4C After patterning the interlayer film 410, a light-reflection film 411A is formed. The light-reflection film 411A is formed on sidewalls 470 and bottom portions 471 of the opening portions 460 and on the interlayer film 410 where the opening portions 460 are not formed. Metal may be used for the light-reflection film 411A. For example, when tungsten is used, the film thickness is about 100 to 300 nm. Furthermore, as the material of the light-reflection film 411A, titanium or aluminum may be used. While various conditions may be set for the film deposition condition of the light-reflection film 411A, the light-reflection film 411A can be formed with a film thickness that enables the steps created by the opening portions 460 formed in the interlayer film 410 to remain. A condition that makes the light-reflection film 411A be deposited so as to totally fill up the steps created by the opening portions 460 is not desirable since it makes it difficult to obtain the desired shape of the light reflection members 411 in the subsequent patterning process.

Subsequently, a resist layer is formed on the light-reflection film 411A, and a photoresist pattern 475 is formed by photolithography so that the resist remains on the sidewalls 470 of the opening portions 460.
FIG. 5A With the photoresist pattern 475 serving as a mask, by patterning the light-reflection film 411A by etching, the light reflection members 411 can be formed on the sidewalls 470 of the opening portions 460 of the interlayer film 410. In the above case, regarding the etching process, dry etching or wet etching can be used. When patterning the light-reflection film 411A, portions of the light-reflection film 411A are removed such that at least a portion of the interlayer film 410 on each of the photodiodes 404 is exposed. With the above, loss of light that is guided to the photodiodes 404 can be reduced. In the present drawing, when patterning the light-reflection film 411A, portions of the light-reflection film 411A that are disposed on upper surface portions 472 of the interlayer film 410 where the opening portions 460 are not formed are removed. However, the photoresist pattern that is an etching mask may be formed so that the light reflection members 411 are also disposed on the upper surface portions 472 of the interlayer film 410.

Considering that contact plugs 413A are connected to the gate electrodes 409, the light-reflection film 411A that is positioned above the gate electrodes 409 may be removed before the interlayer film 412 is formed. Furthermore, as illustrated in FIG. 5A, end portions of the light reflection members 411 may be provided on the upper surface portions 472 of the interlayer film 410 where the opening portions 460 are not formed or the end portions of the light reflection members 411 may be provided on the bottom portions 471 of the interlayer film 410 where the opening portions 460 are formed.
FIG. 5B An interlayer film 412 that is to become the second insulating film is formed so as to sufficiently fill up the steps created by the opening portions 460 of the interlayer film 410. The film thickness of the interlayer film 412 is about 450 to 950 nm, and a silicone oxide film that is formed by CVD is used as the material of the interlayer film 412. Since a wiring layer is formed above the interlayer film 412, a surface planarization process is performed on the interlayer film 412. The height from the semiconductor substrate 401 to an upper surface of the interlayer film 412 after planarization is about 550 to 850 nm. In a case in which the interlayer film 410 is formed so as not to cover the entire gate electrodes 409, the interlayer film 412 is formed so as to sufficiently fill up the steps between the gate electrodes 409 and the interlayer film 410.

Subsequently, contact plugs 413A and 413B are formed after contact holes that penetrate the interlayer film 410 and the interlayer film 412 are formed. The contact plugs 413A are in contact with the gate electrodes 409 of the transfer transistors and the contact plugs 413B are in contact with the drain regions 407 of the transfer transistors. The contact holes are formed so as to connect the above members to a first wiring layer.

The contact plugs 413A and 413B are formed by, for example, embedding a barrier metal and a plug metal in this order into the contact holes and by removing the excessive barrier metal and the plug metal that have bulged out by CMP. Titanium or titanium nitride may be used for the barrier metal. Furthermore, tungsten may be used for the plug metal.

In a case in which the interlayer film 410 is formed so as not to cover the entire gate electrodes 409 of the pixel transistor, contact holes that penetrate only through the interlayer film 412 are formed.

FIG. 6A

Figure 6A:
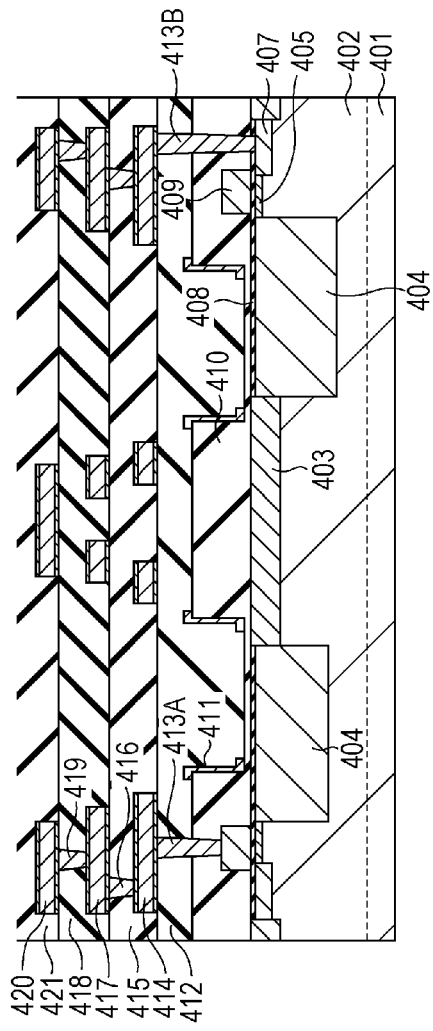
FIGS. 6A and 6B are diagrams illustrating a flow of the manufacturing method according to the first exemplary embodiment.
Figure 6B:
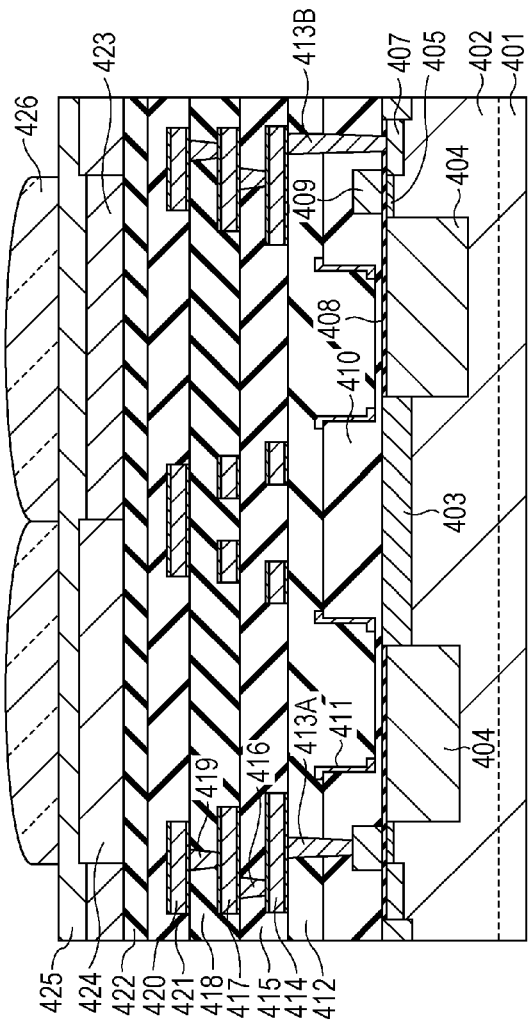

FIG. 6A illustrates a structure of the solid-state image pickup apparatus after three wiring layers have been formed. Other than aluminum wiring, copper wiring formed using a damascene method may be used as well as metal wiring.

After forming a first wiring layer 414 by patterning, formation and planarization of an interlayer film 415 is performed, and the plugs 416 are formed. In a similar manner, a second wiring layer 417, an interlayer film 418, plugs 419, a third wiring layer 420, and an interlayer film 421 are formed. An upper surface of the interlayer film 421 is planarized by CMP.

FIG. 6B

A passivation film 422 is formed on the interlayer film 421. The material of the passivation film 422 is a silicon nitride film, for example. In order to reduce the reflection ratio of the incident light, a layered structure of a silicon nitride film and a silicon oxynitride film may be used as the passivation film 422.

Color filters 423 and 424 are formed on the passivation film 422, and in order to reduce the difference in the level of the color filters 423 and 424, an organic film 425 is formed by spin coating. Furthermore, microlenses 426 are formed on the organic film 425.

In the manufacturing method according to the present exemplary embodiment described above, an interlayer film is formed, the patterning of the interlayer film is performed using photolithography, and the light reflection members are formed on the patterned interlayer film. With the above, regardless of the shapes and positions of the charge transfer electrodes, the shapes and the positions of the light reflection members can be formed in an optional manner.

Furthermore, in the present exemplary embodiment, a description is given with the gate electrodes of the transfer transistors as an example; however, if either one of the pixel transistors satisfies the prerequisite of the claimed disclosure, the pixel transistor is within the scope of the claimed disclosure. Furthermore, a description is given in which contact plugs that are connected to the gate electrodes and the drain region of the pixel transistor are provided as an example; however, the contact plug may be provided in the source region or the like of the pixel transistor.

Second Exemplary Embodiment

In the present exemplary embodiment, a method of manufacturing light reflection members that are different from those of the first exemplary embodiment will be described. Members illustrated with the same reference numerals as those of the first exemplary embodiment are members that are the same as those of the first exemplary embodiment; accordingly, description thereof is omitted.

Figure 7:
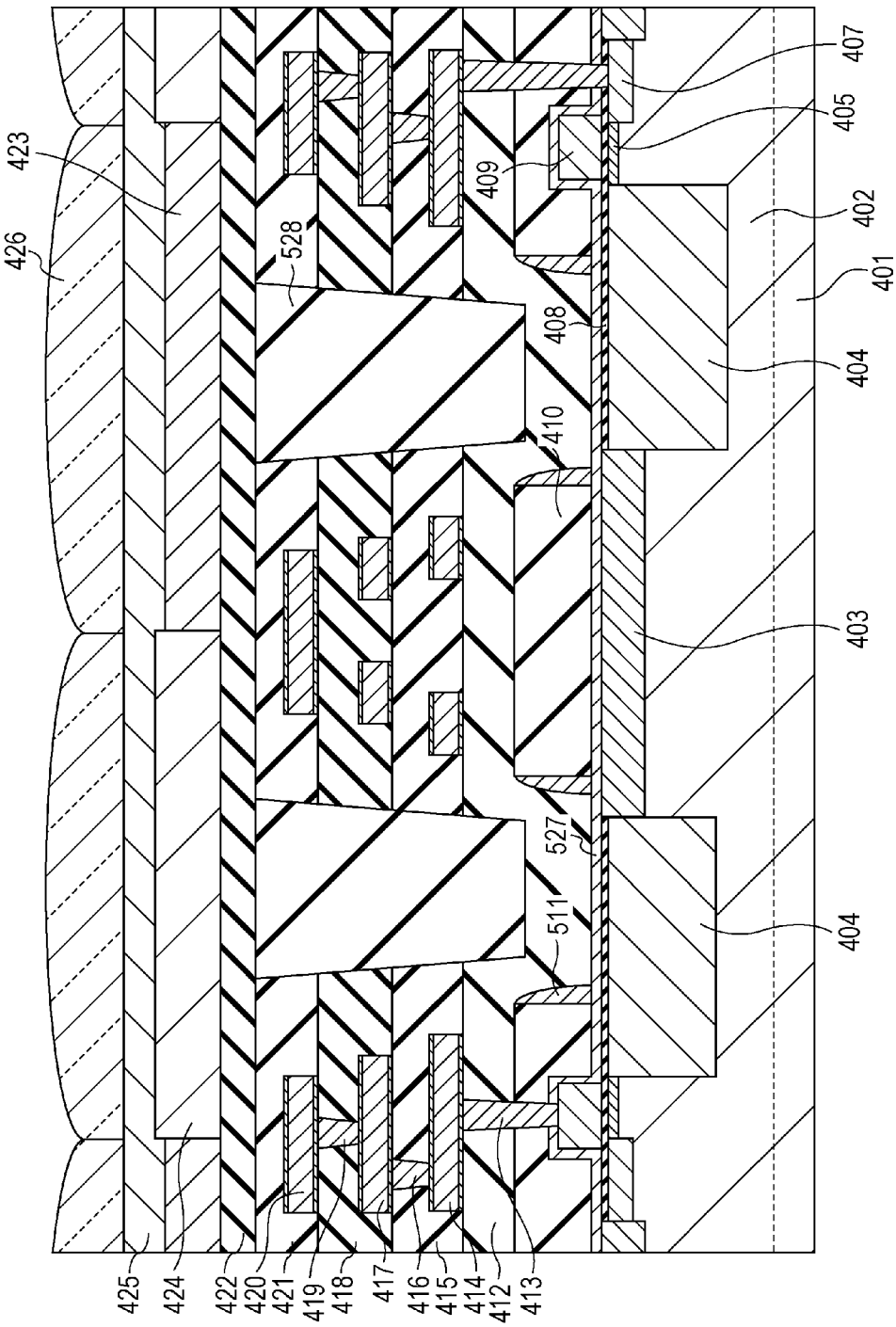
FIG. 7 is a schematic cross-sectional view of a solid-state image pickup apparatus according to a second exemplary embodiment.

FIG. 7 illustrates a solid-state image pickup apparatus in which a silicon nitride film 527 is disposed below the interlayer film 410. The silicon nitride film 527 is formed by performing deposition and patterning before forming the interlayer film 410. The silicon nitride film 527 is used as an etching stop film when the opening portions are formed in the interlayer film 410. Furthermore, the silicon nitride film 527 is also used as a film to supply hydrogen to the photodiodes 404.

In FIG. 7, light reflection members 511 are formed by etch back after forming the light-reflection film. When employing the above method, the forming process and the patterning process of the resist serving as a mask when etching the light reflection members 511 can be omitted.

Furthermore, as illustrated in FIG. 7, optical waveguide structures 528 may be formed after the light reflection members 511 have been formed. The optical waveguide structures 528 are each a structure provided with a portion (a core) having a high refractive index compared to that of the surrounding portion (a clad). According to the above structure, total reflection or Fresnel reflection of the light at the interface between the core and the clad is used to confine the light in the waveguide (the core) so that diffusion of light is suppressed; accordingly, incident light is collected to the photoelectric conversion portions.

Silicon nitride, for example, may be used as the material of the optical waveguide structures 528. Utilizing the advantage of being able to freely design the shapes and positions of the light reflection members 511, the design freedom of the optical waveguide structures 528 can be improved. For example, due to pixel miniaturization, there are cases in which the optical waveguide structure cannot be formed to portions close to the photodiodes because of the restriction in the process. In such a case as well, with the method of the present exemplary embodiment, the light reflection members 511 can be formed from above the photodiodes 404 to a portion around the bottom portion of the optical waveguide structure 528; accordingly, light utilization efficiency can be improved. In the above manufacturing method according to the present exemplary embodiment, the shapes and the positions of the light reflection members can be formed in an optional manner regardless of the shapes and positions of the charge transfer electrodes.

Third Exemplary Embodiment

In the present exemplary embodiment, a method of manufacturing a light reflection members that are different from those of the first and second exemplary embodiments will be described. Members illustrated with the same reference numerals as those of the first and second exemplary embodiments are members that are the same as those of the first and second exemplary embodiments; accordingly, description thereof is omitted.

Figure 8:
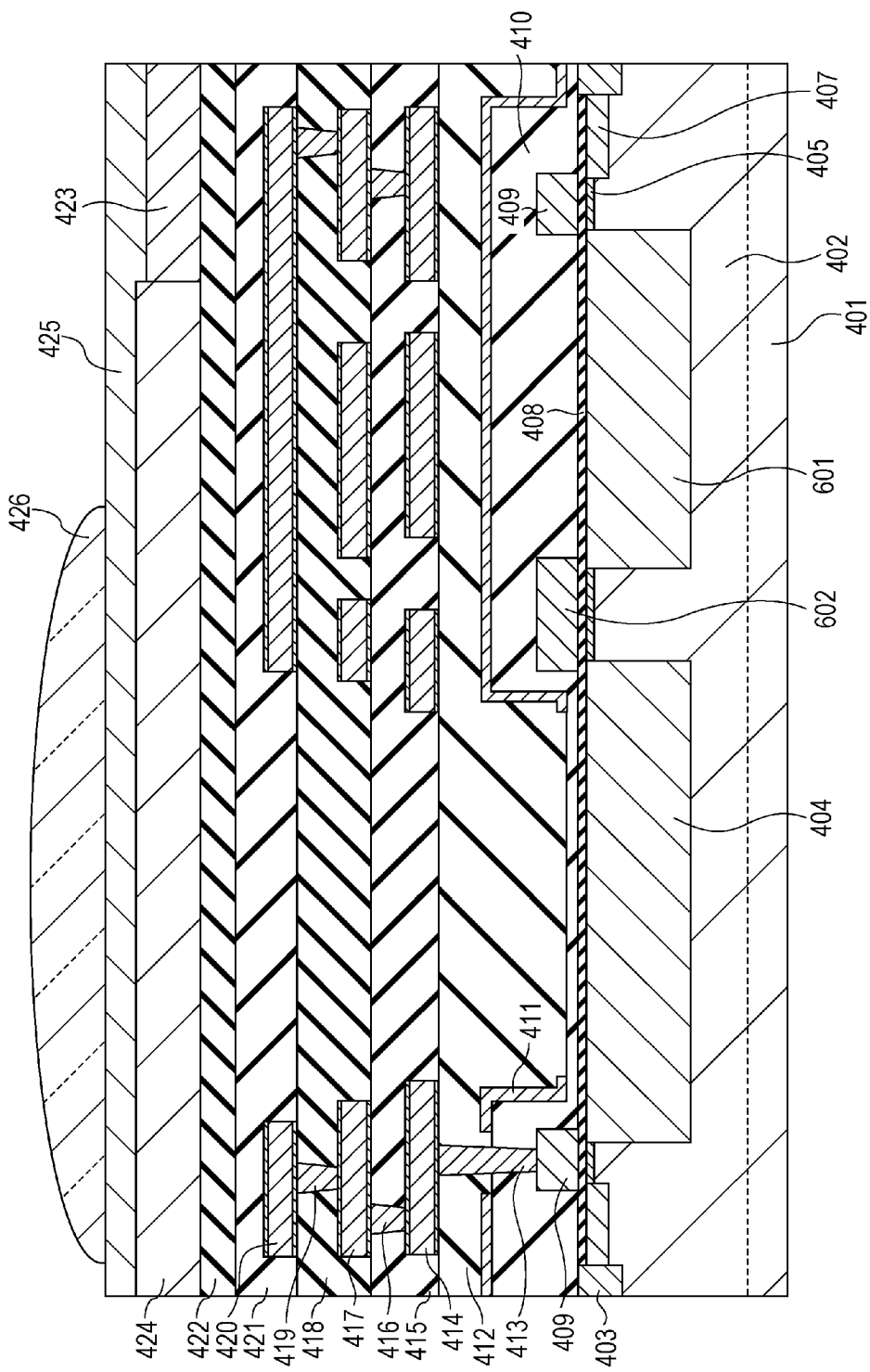
FIG. 8 is a schematic cross-sectional view of a solid-state image pickup apparatus according to a third exemplary embodiment.

FIG. 8 illustrates a gate electrode 602 of a transfer transistor that transfers an electric charge from a photodiode 404, and a charge holding portion 601 that accumulates the transferred electric charge. The charge holding portion 601 accumulates the electric charge so that the exposure time of a plurality of pixel rows, more preferably, the exposure time of the entire image pickup region, becomes the same. In other words, by providing the charge holding portion 601, a global electronic shutter operation can be performed. As described above, in order to equalize the exposure time of the plurality of pixel rows, the charge holding portion 601 needs to hold the electric charge at a different duration for each pixel row. If the electric charge generated at a time other than the exposure time is held by the above charge holding portion 601, it will be difficult to perform imaging with a high image quality.

Accordingly, the charge holding portion 601 needs to be covered by a member that does not transmit light, and the light reflection members 411 are formed at a portion above the charge holding portion 601 and at portion on the photodiode side of the gate electrode 602 as well.

Hereinafter, a flow of a manufacturing process of the present exemplary embodiment will be described while portions overlapping the first exemplary embodiment are omitted. Before forming the gate insulating film 408, a dopant is first implanted in the semiconductor region of the first conductivity type for forming the charge holding portion 601. Subsequently, the gate insulating film 408, the gate electrodes 409 and 602, the interlayer film 410, and the light reflection members 411 are formed. At this time, desirably, the light reflection members 411 are disposed so as to completely cover the charge holding portion 601. Accordingly, after forming the light-reflection film on the interlayer film 410, the light reflection members 411 are fabricated by performing etching so that the light-reflection film remains above the charge holding portion 601. With the above-described manufacturing method according to the present exemplary embodiment, regardless of the height and arrangement of the gate electrodes of the pixel region, the shape and the position of the light reflection members can be formed in an optional manner.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-210223, filed Oct. 14, 2014, which is hereby incorporated by reference herein in its entirety.

What is claimed is:

1. A method of manufacturing a solid-state image pickup apparatus, comprising:
    forming a first insulating film on a substrate that includes a photoelectric conversion portion and a gate electrode of a pixel transistor, the first insulating film covering the photoelectric conversion portion and the gate electrode of the pixel transistor;
    forming a photoresist pattern on the first insulating film;
    forming an opening portion by removing the first insulating film formed above the photoelectric conversion portion while having the photoresist pattern serve as a mask;
    forming a light reflection member on a sidewall of the opening portion formed in the first insulating film;
    forming a second insulating film on the first insulating film and the light reflection member; and
    forming, after the second insulating film has been formed, a contact plug that penetrates the first insulating film and the second insulating film and that is in contact with the gate electrode of the pixel transistor.

2. The method of manufacturing a solid-state image pickup apparatus according to claim 1, wherein:
    the forming of the light reflection member includes:
        forming a light-reflection film on the sidewall and a bottom portion of the opening portion and on an upper surface portion of the first insulating film where the opening portion is not formed, and
        removing the light-reflection film that is positioned above the photoelectric conversion portion.

3. The method of manufacturing a solid-state image pickup apparatus according to claim 1, wherein:
    the forming of the light reflection member includes:
        forming a light-reflection film on the sidewall and a bottom portion of the opening portion and on an upper surface portion of the first insulating film where the opening portion is not formed, and
        removing the light-reflection film that is formed on the upper surface portion of the first insulating film where the opening portion is not provided.

4. The method of manufacturing a solid-state image pickup apparatus according to claim 1, wherein:
    the forming of the light reflection member includes:
        forming a light-reflection film on the sidewall and a bottom portion of the opening portion and on an upper surface portion of the first insulating film where the opening portion is not formed, and
        etch-backing the light-reflection film.

5. The method of manufacturing a solid-state image pickup apparatus according to claim 1, further comprising:
    forming, after the forming of the contact plug, an optical waveguide structure that guides incident light to the photoelectric conversion portion.

6. The method of manufacturing a solid-state image pickup apparatus according to claim 2, wherein:
    the substrate includes a charge holding portion that accumulates a signal charge that is transferred from the photoelectric conversion portion, and
    in the forming of the light reflection member, the light reflection member is formed while the light-reflection film above the charge holding portion is made to remain.

7. The method of manufacturing a solid-state image pickup apparatus according to claim 1, wherein:
    the light reflection member is constituted or made of metal.

8. The method of manufacturing a solid-state image pickup apparatus according to claim 1, wherein:
    the light reflection member is constituted or made of tungsten.

9. A method of manufacturing a solid-state image pickup apparatus, comprising:
    forming a first insulating film on a substrate that includes a photoelectric conversion portion and a pixel transistor, the first insulating film covering the photoelectric conversion portion and the pixel transistor;
    forming a photoresist pattern on the first insulating film;
    forming an opening portion by removing the first insulating film formed above the photoelectric conversion portion while having the photoresist pattern serve as a mask;
    forming a light reflection member on a sidewall of the opening portion formed in the first insulating film;
    forming a second insulating film on the first insulating film and the light reflection member; and
    forming, after the second insulating film has been formed, a contact hole so that the contact hole penetrates the first insulating film and the second insulating film, the contact hole connecting the pixel transistor and a wiring layer to each other.

* * * * *